US008866558B2

(12) United States Patent
Li et al.

(10) Patent No.: US 8,866,558 B2
(45) Date of Patent: Oct. 21, 2014

(54) INTEGRATED STANDING-WAVE VOLTAGE CONTROLLED OSCILLATOR WITH DUAL-MODE COPLANAR WAVEGUIDE RESONATOR

(75) Inventors: Ming Li, Ottawa (CA); Khelifa Hettak, Ottawa (CA); Rony E. Amaya, Ottawa (CA); Adrian Momciu, Ottawa (CA); Luc A. Desormeaux, Ottawa (CA); Valek Szwarc, Ottawa (CA)

(73) Assignee: Her Majesty the Queen in Right of Canada, as Represented by the Minister of Industry, Through the Communications Research Centre Canada, Ottawa (CA)

( * ) Notice: Subject to any disclaimer, the term of this patent is extended or adjusted under 35 U.S.C. 154(b) by 182 days.

(21) Appl. No.: 13/448,549

(22) Filed: Apr. 17, 2012

(65) Prior Publication Data
US 2013/0271230 A1    Oct. 17, 2013

(51) Int. Cl.
*H03K 3/354*    (2006.01)
*H03B 5/18*    (2006.01)

(52) U.S. Cl.
CPC ...... *H03B 5/1841* (2013.01); *H03B 2200/0024* (2013.01); *H03B 5/1852* (2013.01)
USPC ............. 331/117 R; 331/117 FE; 331/117 D; 331/108 A; 331/107 SL; 331/167

(58) Field of Classification Search
CPC ............... H03B 5/1841; H03B 5/1852; H03B 2200/0024
USPC .. 331/117 R, 117 FE, 117 D, 108 A, 107 SL, 331/167
See application file for complete search history.

(56) References Cited

U.S. PATENT DOCUMENTS

| 5,087,896 | A * | 2/1992 | Wen et al. ........................ 331/99 |
| 6,950,590 | B2 * | 9/2005 | Cheung et al. ................ 385/129 |
| 7,741,921 | B2 * | 6/2010 | Ismailov .......................... 331/55 |
| 2003/0151465 | A1 * | 8/2003 | Wood ....................... 331/107 SL |
| 2006/0238266 | A1 * | 10/2006 | Harjani et al. ................. 331/167 |
| 2011/0169581 | A1 * | 7/2011 | Chung ............................. 331/57 |

OTHER PUBLICATIONS

Ming Li et al., "Design of mM-W Fully Integrated CMOS Standing-Wave VCOs Using Low-Loss CPW Resonators," *IEEE Transaction on Circuits and Systems-II Express Briefs*, vol. 59, No. 2., pp. 78-82, Feb. 2012.
H. Veenstra et al., "60GHz VCOs with transmission line resonator in a 0.25μm SiGe BiCMOS technology", *IEEE Radio Frequency Integrated Circuits Symposium*, 2008, pp. 119-122.

(Continued)

*Primary Examiner* — Arnold Kinkead
*Assistant Examiner* — Richard Tan
(74) *Attorney, Agent, or Firm* — Teitelbaum & MacLean; Neil Teitelbaum; Doug MacLean

(57) ABSTRACT

A standing wave oscillator includes a cross-coupled differential transistor pair having a pair of input terminals and a pair of output terminals; and a resonant circuit coupled to the input terminals of the cross-coupled differential transistor pair. The resonant circuit includes: a capacitance between the input terminals of the cross-coupled differential transistor pair; and a differential dual-mode coplanar waveguide (CPW) having opposite differential ends thereof connected to respective input terminals of the cross-coupled differential transistor pair. CPW ground lines of the differential dual-mode coplanar waveguide each have a first end thereof connected to the first supply voltage and have a second end thereof floating or unterminated.

14 Claims, 8 Drawing Sheets

(56) References Cited

OTHER PUBLICATIONS

Rony E. Amaya et al. "Coplanar Waveguides in Silicon with Low Attenuation and Slow Wave Reduction", *Proceeding of the 37th European Microwave Conference*, Munich Germany, pp. 508-511, Oct. 2007.

Ming Li et al., "Standing-Wave Transmission-Line—Resonator VCO for E-band Applications" *Communications Research Canada, 978-1-61284-080, Crown*, 2011.

* cited by examiner

INTEGRATED STANDING-WAVE VOLTAGE CONTROLLED OSCILLATOR WITH DUAL-MODE COPLANAR WAVEGUIDE RESONATOR

BACKGROUND AND SUMMARY

1. Field

This invention pertains to the field of voltage controlled oscillators (VCOs), and more particularly to an integrated standing wave VCO.

2. Description

The continuous growth of broadband data communications has resulted in the opening of V-band and even E-band for terrestrial wireless applications. In transceiver systems, the voltage-controlled oscillator (VCO) is a key component. It provides the required local reference signal for frequency translation. For the system-on-a-chip realization of wireless transceivers, fully integrated VCO circuits are in high demand, since they provide easy and flexible integration with more reliable performance. But at millimeter wave frequencies, designing such circuits is a big challenge because it requires low-parasitic, high-quality passive devices and active devices to achieve acceptable tuning range and phase noise levels. Fortunately, modern complementary metal oxide semiconductor (CMOS) technology has pushed the cut-off and maximum frequencies of active CMOS devices beyond 100 GHz, and implementing integrated VCOs at such high frequencies has become feasible. In the past few years, great efforts have been made in this domain, with a focus on reducing the phase noise and increasing the frequency tuning range.

In the VHF, UHF, and low GHz microwave frequency bands, many VCOs employ an on-chip lump spiral inductor as the inductive component in the LC tank. However; in the higher microwave and millimeter wave bands, this type of inductor suffers from serious substrate losses. This prevents the VCO from achieving low phase noise and wide tuning range.

Accordingly, it would be advantageous to provide an integrated oscillator at microwave and millimeter wave frequencies that can provide good phase noise performance. It would further be desirable to provide an integrated VCO at microwave and millimeter wave frequencies that can provide good phase noise performance and a wide tuning range.

The present invention comprises an integrated standing-wave voltage controlled oscillator with a dual-mode coplanar waveguide resonator.

In one aspect of the invention, a voltage controlled oscillator (VCO) is provided that is integrated with a semiconductor substrate. The VCO comprises: a pair of oscillator transistors and a resonant circuit. The oscillator transistors each have a control terminal and an output terminal. The oscillator transistors are cross-coupled to each other such that an output of each oscillator transistor is coupled to an input of the other oscillator transistor. The resonant circuit is connected between the control terminals of the pair of oscillator transistors. The resonant circuit comprises a dual-mode coplanar waveguide resonator and first and second varactors each having a first end thereof connected to a tuning voltage input and having a second end connected to the control terminal of a corresponding one of the oscillator transistors. The dual-mode coplanar waveguide resonator comprises: an electrically conductive common line extending lengthwise in a first direction and connected to a first supply voltage for the oscillator transistors; and at least first through fifth electrically conductive lines sequentially arranged lengthwise substantially in parallel with each other in a second direction which is substantially perpendicular to the electrically conductive common line. The electrically conductive common line and the first through fifth linear electrically conductive lines are all arranged at a first level with respect to the semiconductor substrate. Each of the first through fifth linear electrically conductive lines has a first end and a second end opposite the first end. The first ends of the first through fifth electrically conductive lines are all connected to the electrically conductive common line; the second ends of the second and fourth electrically conductive lines are each connected to the output terminal of a corresponding one of the oscillator transistors; and the second ends of the first, third, and fifth electrically conductive lines are floating.

In another aspect of the invention, a voltage controlled oscillator (VCO) comprises a cross-coupled differential transistor pair having a pair of input terminals and a pair of output terminals; and a resonant circuit coupled to the input terminals of the cross-coupled differential transistor pair. The resonant circuit comprises: a pair of voltage-dependent capacitive elements and a pair of inductive elements. Each voltage-dependent capacitive element is connected between a corresponding one of the output terminals of the cross-coupled differential transistor pair and a control voltage terminal. Each inductive element is connected between a first supply voltage and a corresponding one of the output terminals of the cross-coupled differential transistor pair. Each inductive element comprises a coplanar waveguide. Each coplanar waveguide includes: a central signal line and a pair of coplanar waveguide (CPW) ground lines disposed on either side of the central signal line. Each signal line is connected at a first end to the first supply voltage and at a second end to the corresponding one of the output terminals of the cross-coupled differential transistor pair. Each of the CPW ground lines is connected at one end to the first supply voltage and is floating at the other end.

In yet another aspect of the invention, a standing wave oscillator comprises: a cross-coupled differential transistor pair having a pair of input terminals and a pair of output terminals; and a resonant circuit coupled to the input terminals of the cross-coupled differential transistor pair. The resonant circuit comprises: a capacitance between the input terminals of the cross-coupled differential transistor pair; and a differential dual-mode coplanar waveguide (CPW) having opposite differential ends thereof connected to respective input terminals of the cross-coupled differential transistor pair, wherein CPW ground lines of the differential dual-mode coplanar waveguide each have a first end thereof connected to a first supply voltage and have a second end thereof floating or unterminated.

DETAILED DESCRIPTION

As used herein, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As used herein, the term "approximately" means within +/−5% of the nominal value. The term "substantially" means within 10% of the nominal value.

Described below in connection with the drawings are example embodiments of an integrated standing-wave voltage controlled oscillator with a dual-mode coplanar waveguide resonator. Further details regarding one or more of these embodiments may be found in M. Li wt al., "Standing-Wave Transmission-Line-resonator VCO for E-band applications," 12th Annual IEEE Wireless and Microwave Technology Conference (WAMICON) (April 2011).

The various embodiments as described below will illustrate several aspects of the inventive concept, various combinations of which may be present in different embodiments of the inventive concept. These aspects include but are not limited to: (1) the use of a new modified dual-mode coplanar waveguide (CPW) as a standing-wave transmission line resonator; (2) the use of the new modified CPW as a DC feeding line to the gain devices or transistors of the VCO; and (3) the integration of the new modified CPW with slow-wave structures. In some embodiments, these aspects of the inventive concept may: (1) reduce the insertion loss and increase the Q factor of the resonator in comparison to standard stripline and microstrip structures; (2) reduce parasitic effects and render the circuit more compact; and (3) reduce the phase noise of the VCO. It should be understood that not all embodiments of the inventive concept will exhibit all of these aspects, however certain synergies and particular benefit may pertain to those embodiments which exhibit a combination of these aspects.

Figure 1:
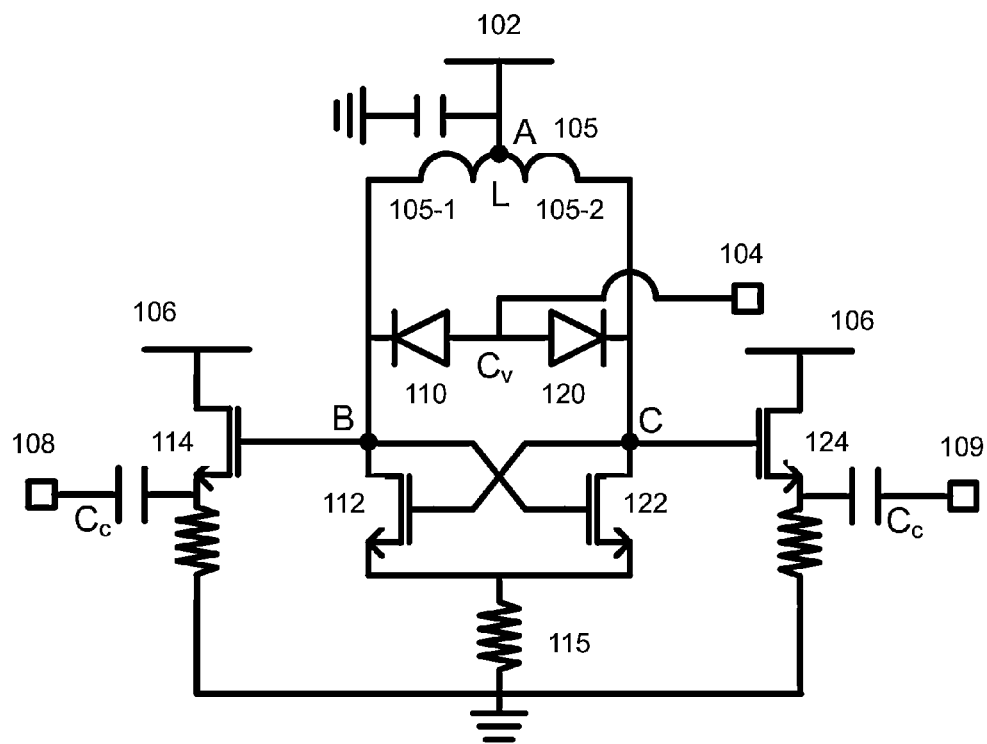
FIG. 1 is a schematic diagram of one example embodiment of a voltage controlled oscillator (VCO).

FIG. 1 is a schematic diagram of one example embodiment of a voltage controlled oscillator (VCO) 100. VCO 110 includes an inductive element 105, voltage-variable capacitive elements 110 and 120, and a cross-coupled differential transistor pair comprising first and second oscillator transistors 112 and 122.

First and second oscillator transistors 112 and 122 represent the gain-producing or active elements for the oscillation of VCO 100. In some embodiments, first and second oscillator transistors 112 and 122 may be complementary metal oxide layer (CMOS) devices. First and second oscillator transistors 112 and 122 each have an input terminal (e.g., a gate) and an output terminal (e.g., a drain). As noted above, first and second oscillator transistors 112 and 122 comprise a cross-coupled differential transistor pair wherein the output terminal of each transistor is connected to the input terminal of the other transistor.

Inductive element 105 is connected to a first supply voltage terminal 102 and supplies a first supply voltage to provide bias for first and second oscillator transistors 112 and 122. Inductive element 105 may comprise, or be considered to comprise, a pair of inductive elements 105-1 and 105-2 each connected between an input terminal of a corresponding one of the first and second oscillator transistors 112 and 122 and first supply voltage terminal 102. Details of an embodiment of inductive element 105 will be discussed in further detail below.

Voltage-variable capacitive elements 110 and 120 may comprise varactors whose capacitance is controllably varied in response to a tuning voltage applied to a tuning voltage terminal 104 so as to tune VCO 100 to a desired frequency. Voltage-variable capacitive elements 110 and 120 provide a capacitance between the input terminals of the cross-coupled differential transistor pair (and also, by the way, between the output terminals of the opposite transistors of the cross-coupled differential transistor pair).

It should be noted that VCO 100 may be converted to a fixed frequency oscillator by replacing voltage-variable capacitive elements 110 and 120 with fixed capacitors.

Inductive elements 105-1 and 105-2 and voltage-variable capacitive elements 110 and 120 together form a resonant circuit that is coupled to the input terminals of the cross-coupled differential transistor pair (and also, by the way, is coupled to the output terminals of the opposite transistors of the cross-coupled differential transistor pair). In particular, each voltage-dependent capacitive element 110/120 is connected between a corresponding one of the output terminals of the cross-coupled differential transistor pair and control voltage terminal 104, and each inductive element 105-1/105-2 is connected between first supply voltage terminal 102 and a corresponding one of the output terminals of the cross-coupled differential transistor pair.

VCO 100 also includes a current supply resistor 115 having a first end connected to third terminals (e.g., drains) of each of the first and second oscillator transistors 112 and 122 and having a second end connected to a second supply voltage terminal (e.g., ground) for first and second oscillator transistors 112 and 122.

VCO 100 further includes first and second buffers 114 and 124 each having a corresponding input terminal (e.g., a gate) and an output terminal (e.g., a source) 108 and 109, respectively. Each input terminal is connected to the output terminal (e.g., drain) of a corresponding one of first and second oscillator transistors 112 and 122. The oscillating output signal of the VCO is provided as a differential signal between the output terminals 108 and 108 of first and second buffers 114 and 124. In the embodiment illustrated in FIG. 1, first and second buffers 114 and 124 each comprise a single transistor, for example a CMOS device. However in other embodiment, other buffer devices may be employed.

The oscillating frequency $F_{OSC}$ of VCO 100 is determined by the inductance value L and capacitance value C of the resonant circuit, including any parasitic values such as the capacitances of the first and second oscillator transistors 112 and 122, according to the equation:

$$F_{OSC} = \frac{1}{2\pi\sqrt{LC}}, \quad (1)$$

where L is the inductance of each of the inductive elements 105-1 and 105-2, and where:

$$C = C_V + C_P = C_V + (C_{OSC,gs} + C_{OSC,ds} + C_{BUF,gs} + C_{BUF,gd}),$$

where $C_V$ is the capacitance of each of the voltage-dependent capacitive elements 110/120; $C_P$ is a total parasitic capacitance of the resonant circuit; $C_{OSC}$ the capacitance of each of the oscillator transistors 112/122; and $C_{BUF}$ is the capacitance of each of the buffer transistors 114/124. Here, the subscript "gs" indicates the gate and source, "gd" indicates the gate and drain, and "ds" indicates the drain and source.

The maximum frequency of VCO 100 occurs when voltage-dependent capacitive elements 110/120 have their minimum capacitance value, and the minimum frequency of VCO 100 occurs when voltage-dependent capacitive elements 110/120 have their maximum capacitance value. From equations (1) and (2), it can be seen that the frequency tuning range of VCO is reduced by the parasitic capacitance $C_P$ of the resonant circuit.

As indicated above, in the VHF, UHF, and low GHz microwave frequency bands, many VCOs employ an on-chip lump spiral inductor as the inductive component in the LC tank. However; in the higher microwave and millimeter wave bands, this type of inductor suffers from serious substrate losses. This prevents the VCO from achieving low phase noise and wide tuning range.

To address these issues, the present inventors have conceived of a novel resonator structure for providing the inductance in the tank circuit (resonant circuit) of a VCO such as VCO 100. In particular, the inventors have conceived of a novel arrangement which employs a differential dual-mode coplanar waveguide as a resonator—operating in conjunction with one or more capacitive elements, in particular voltage-dependent capacitive elements (e.g., varactors)—in a resonant circuit to set an operating frequency of an oscillator (e.g., a VCO) and also to supply a bias current to the gain-producing or active devices (e.g., oscillator transistor(s)) of the oscillator. Embodiments of such an arrangement will be described below, first by explaining a structure and operation of a coplanar waveguide, and then by describing a novel arrangement of a differential coplanar waveguide in a VCO.

Figure 2:
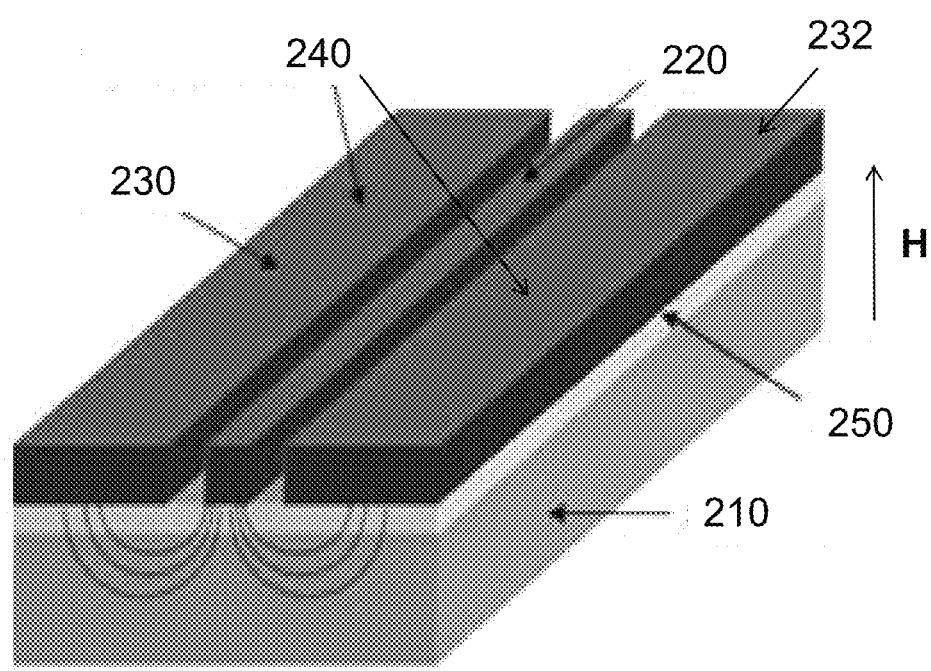
FIG. 2 illustrates one example embodiment of a coplanar waveguide.

FIG. 2 illustrates one example embodiment of a coplanar waveguide 200. Coplanar waveguide 200 is formed on a substrate (e.g., a semiconductor substrate) 210 and includes a central signal line 220 extending lengthwise, and electrodes 230 and 232, each forming a CPW ground line 240 on opposite sides of central signal line 220 extending lengthwise in parallel with central signal line 220. The example embodiment of FIG. 2 includes a thin film, e.g. a ferroelectric thin film, on substrate 210 and on which central signal line 220 and electrodes 230 and 232 are formed.

Here, a coplanar waveguide is defined as a structure in which a signal line and two corresponding CPW ground lines are disposed at a same level or layer of a device (i.e., at a same height H or distance with respect to substrate 210) and extend lengthwise in parallel with each other from one end to the other end thereof. The term "coplanar" can be understood to refer to the fact that it could be considered that if the metal layer forming signal line 220 and corresponding CPW ground lines 240 were so thin as to be planar, then they would lie in the same plane as each other. It should be understood that many other structures or devices may be integrated with coplanar waveguide 200 and substrate 210, and some of such structures and devices may be disposed at several different layers or levels with respect to semiconductor substrate 200.

When the electrodes 230 and 232 are referred to here as "CPW ground lines" it does not mean that the electrodes are necessarily connected to a common supply voltage (e.g., supply voltage ground). Instead, it means that the voltage on each of the electrodes 230 and 232 at an operating frequency (e.g., a microwave frequency or millimeter wave frequency) of coplanar waveguide 200 has a difference relative or with respect to signal line 220. In particular, when an RF current passes along signal line 220 it induces opposite charges on each CPW ground line 240, producing a voltage difference between signal line 220 and each of the electrodes 230 and 23. Hereafter, with this understanding in mind, these electrodes laterally disposed on both sides of a signal line in a coplanar waveguide will be referred to as CPW ground lines.

Figure 3:
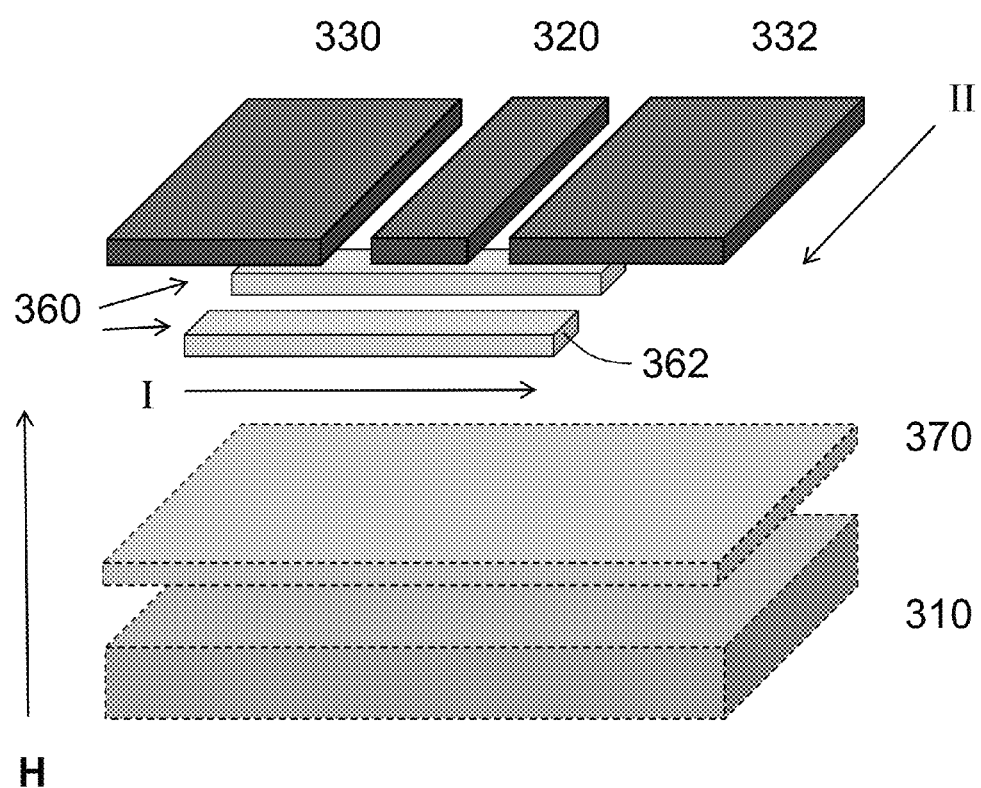
FIG. 3 illustrates one example embodiment of a slow-wave coplanar waveguide.

FIG. 3 illustrates one example embodiment of a slow-wave coplanar waveguide 300. Slow-wave coplanar waveguide 300 is formed on a substrate (e.g., a semiconductor substrate), 310 and includes a central signal line 320 extending lengthwise, and CPW ground lines 330 and 332 disposed on opposite sides of central signal line 320 extending lengthwise in parallel with central signal line 320. Slow-wave coplanar waveguide 300 further includes a floating electrically conductive electrode layer 360 separated and spaced apart from signal line 320 and CPW ground lines 330 and 332 at a different layer, level, or height H with respect to substrate 310. Electrically conductive electrode layer 360 creates a "folded dielectric" effect, allowing high capacitance values to be achieved while simultaneously maintaining a large separation between signal line 320 and CPW ground lines 330/332, thereby maximizing magnetic flux coupling between the two line and thereby giving a large L. Beneficially, electrically conductive electrode layer 360 is perforated in a pattern resembling railroad ties, having a plurality of separated and spaced apart conductive lines 362 each extending lengthwise in a first direction ("I") which is substantially perpendicular to a second direction ("II") in which central signal line 320 and CPW ground lines 330 and 332 extend. By breaking electrically conductive electrode layer 360 into a plurality of isolated elements 362, eddy currents 362 may be inhibited, thereby minimizing this source of loss.

In some embodiments, a metal ground shield 370 may be disposed under the floating metal layer 360 to minimize field penetration into substrate 310.

Further details regarding coplanar waveguides may be found in Rony E Amaya et al., "Coplanar Waveguides in Silicon with Low Attenuation and Slow Wave Reduction," PROCEEDINGS OF THE 37$^{TH}$ EUROPEAN MICROWAVE CONFERENCE, pp. 508-511 (October 2007).

Figure 4A:
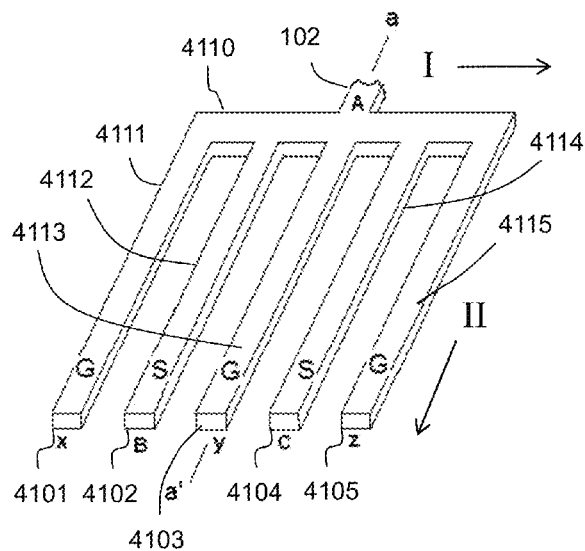
FIG. 4A illustrates one example embodiment of a differential coplanar waveguide resonant element for the VCO of FIG. 1.

FIG. 4A illustrates one example embodiment of a differential coplanar waveguide resonant element 4100 for VCO 100 of FIG. 1. Differential coplanar waveguide resonant element 4100 includes an electrically conductive common line 4110 extending lengthwise in a first direction ("I"), and first through fifth electrically conductive lines 4101, 4102, 4103, 4103 and 4105, sequentially arranged lengthwise substantially in parallel with each other in a second direction ("II") which is substantially perpendicular to electrically conductive common line 4110.

Differential coplanar waveguide resonant element 4100 may be inserted into VCO 100 of FIG. 1 in place of inductive element 105 by connecting the corresponding nodes "A," "B," and C" of differential coplanar waveguide resonant element 4100 as shown in FIG. 4A to the correspondingly labeled nodes in FIG. 1. The description to follow assumes that coplanar waveguide resonant element 4100 is inserted and connected this way in VCO 100 and fabricated as an integrated device on a substrate (e.g., a semiconductor substrate) (not shown in FIG. 4A).

Electrically conductive common line 4110 and first through fifth linear electrically conductive lines 4101~4105 are all arranged at a first level, layer, or height with respect to the semiconductor substrate to form differential coplanar waveguide 4100. Beneficially, electrically conductive common line 4110 and first through fifth linear electrically conductive lines 4101~4105 may all be fabricated on a single metal layer of a semiconductor device. Electrically conductive common line 4110 is connected at the middle thereof to a first supply voltage terminal 102 for first and second oscillator transistors 112 and 122. Each of the first through fifth linear electrically conductive lines 4101~4105 have a first end and a second end opposite the first end. The first ends of first through fifth electrically conductive lines 4101~4105 are all connected to electrically conductive common line 4110.

Second and fourth electrically conductive lines 4102 and 4104 are signal lines and each also supplies a DC bias voltage and current to the output terminal of a corresponding one of the first and second oscillator transistors 112 and 122. In some embodiments, the lengths of second and fourth electrically conductive lines 4102 and 4104 are each one quarter of a wavelength ($\lambda/4$) with respect to an oscillating frequency of VCO 100—beneficially with respect to a central operating frequency of within the tuning range VCO 100. Beneficially, however, the length of second and fourth electrically conductive lines 4102 and 4104 can be shortened to below a quarter-wavelength since they are each terminated with the parasitic capacitance Cp. The benefit is that the shorter the length of the line the less the amount of loss.

First, third, and fifth electrically conductive lines 4101, 4103, and 4015 are CPW ground lines of the differential coplanar waveguide 4100. Beneficially, the second ends of the first, third, and fifth electrically conductive lines 4101, 4103, and 4015, which are labeled x, y, and z respectively in FIG. 4A, are floating. That is, the second ends x, y, and z of the first, third, and fifth electrically conductive lines 4101, 4103, and 4015 are unterminated and unconnected to any circuit element of VCO 100, and in particular are not connected to a common supply ground for VCO 100. As a result, ground noise won't be pickup by DC supply lines.

Accordingly, differential coplanar waveguide resonant element 4100 can be seen to comprise a pair of inductive elements, each inductive element being connected between first supply voltage terminal 102 and a corresponding one of the output terminals of the cross-coupled differential transistor pair, wherein each inductive element comprises a coplanar waveguide. Each coplanar waveguide includes: a central signal line 4102/4104 connected at a first end to first supply voltage terminal 102 and at a second end to the corresponding one of the output terminals of the cross-coupled differential transistor pair, and a pair of virtual RF ground lines 4101&4103/4103&4105 disposed on either side of the central signal line 4102/4104, each of the virtual RF ground lines connected at one end to first supply voltage 102 and floating at the other end.

Figure 4B:
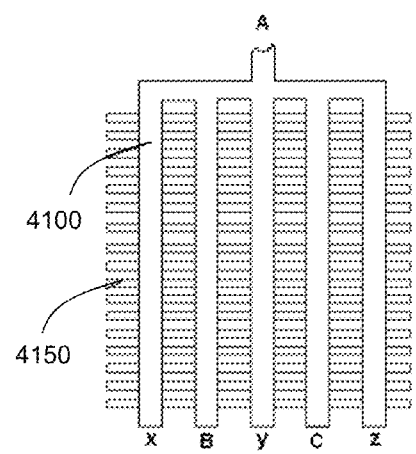
FIG. 4B illustrates another example embodiment of a differential coplanar waveguide resonant element for the VCO of FIG. 1.

FIG. 4B illustrates an example embodiment of a slow-wave differential coplanar waveguide resonant element 4200 for VCO 100. Slow-wave differential coplanar waveguide resonant element 4200 may be inserted into VCO 100 of FIG. 1 in place of inductive element 105 by connecting the corresponding nodes "A," "B," and "C" of differential coplanar waveguide resonant element 4200 as shown in FIG. 4B to the correspondingly labeled nodes in FIG. 1.

Slow-wave differential coplanar waveguide resonant element 4200 is the same as differential coplanar waveguide resonant element 4100, except for the addition of a floating electrically conductive electrode layer 4150 separated and spaced apart from central signal lines 4102/4104 and CPW ground lines 4101/4103/4105 at a different layer, level, or height with respect to the substrate (not shown in FIG. 4B). Beneficially, electrically conductive electrode layer 4150 is perforated in a pattern resembling railroad ties, having a plurality of separated and spaced apart conductive lines each extending lengthwise in the first direction ("I") which is substantially perpendicular to a second direction ("II") in which central signal lines 4102/4104 and CPW ground lines 4101/4103/4105 extend.

As explained above with respect to FIG. 2, when an RF current passes along signal lines 4102 and 4104 it induces opposite charges on the CPW ground lines 4101, 4103 and 4105, producing a voltage difference between adjacent lines, even though CPW ground lines 4101, 4103 and 4105 are not connected to a common or supply ground (i.e., DC ground).

Figure 5:
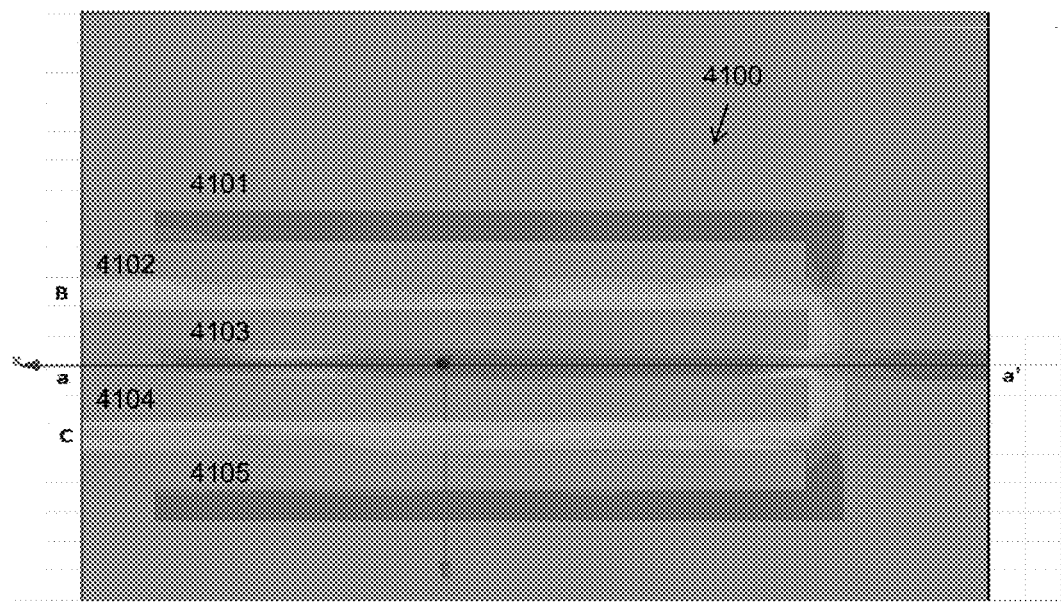
FIG. 5 illustrates another view of differential coplanar waveguide resonant element.
Figure 5:
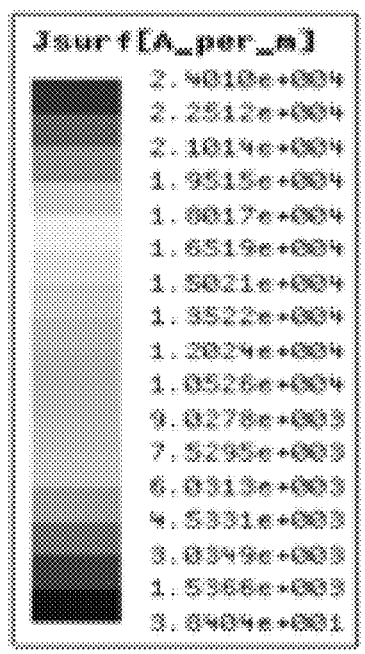

To illustrate this, FIG. 5 shows current (or charge) distributions along first through fifth electrically conductive lines 4101~4105 of differential coplanar waveguide resonant element 4100.

The line a-a' in FIGS. 4A & 5 illustrate a location of a "virtual RF ground" for differential coplanar waveguide resonant element 4100. Because of the differential signal, a perfect E (Electric) wall is formed along the line a-a' (which is equivalent to a short circuit). For this reason it is referred to as a virtual RF ground.

From FIG. 5 one can see that for each of the two signal lines 4102/4104, the two CPW ground lines on each side, 4101/4103 and 4103/4105, do not have equal potential. This is due to (1) the DC bias being added through the center point 'A'; (2) the terminals x, y, and z floating; and (3) the CPWs have unequal widths. The odd mode is excited in a CPW. In most CPW application, the odd mode is unwanted because it causes extra power loss.

In this situation, dual-mode operation (i.e., even and odd mode operation) can actually benefit the VCO circuit by increasing its tuning range.

Figure 6:
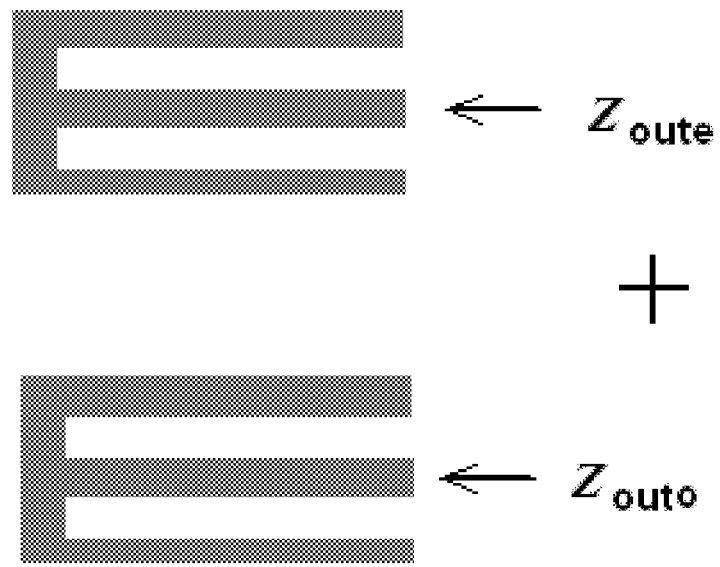
FIG. 6 illustrates a dual-mode coplanar waveguide with unequal ground lines on opposite sides of a signal line.
Figure 7:
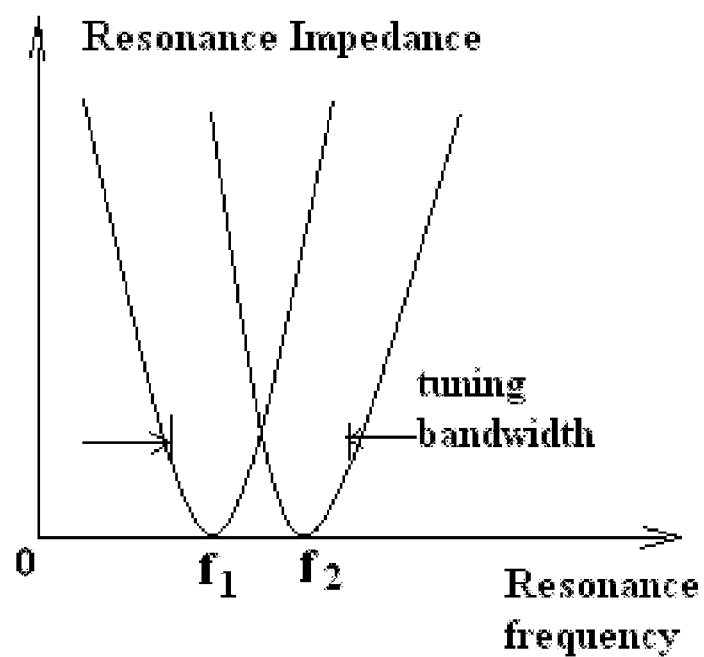
FIG. 7 illustrates an example of how a wider tuning range may be achieved by employing a dual-mode coplanar waveguide.

FIGS. 6 and 7 will now be employed to provide an explanation for this feature.

As illustrated in FIG. 6, we let $Z_{oute}$ and $Z_{outo}$ stand for the even mode and odd mode output impedance, respectively, of a shorted CPW line. Then:

$$Z_{oute} = jZ_{oe} \tan\left(\frac{2\pi}{\lambda_e}d\right) \quad (3)$$

$$Z_{outo} = jZ_{oo} \tan\left(\frac{2\pi}{\lambda_o}d\right),$$

where $Z_{oe}$ and $Z_{oo}$ are the even and odd mode characteristic impedances, $\lambda e$ and $\lambda o$ are the even and odd mode wavelengths, and d is the length of the transmission line. Beneficially, as illustrated in FIG. 7, due to the fact that both $Z_{oute}$ and $Z_{outo}$ are loaded into the oscillation loop, a two tone oscillator is produced with resonant frequencies $f_1$ and $f_2$ which are separated in frequency from each other. Accordingly the differential coplanar waveguide resonators 4100 and 4200 which may be employed in embodiments of VCO 100 each may be referred to as a differential dual-mode coplanar waveguide.

Also, referring back to FIG. 5, one can also see that there is a tapering effect, especially in the middle CPW ground line 4103, where the current density becomes higher towards the shorted end of the line. This effect fluctuates with the oscillating signals, further increasing the tuning range of the VCO.

Figures 8A, 8B:
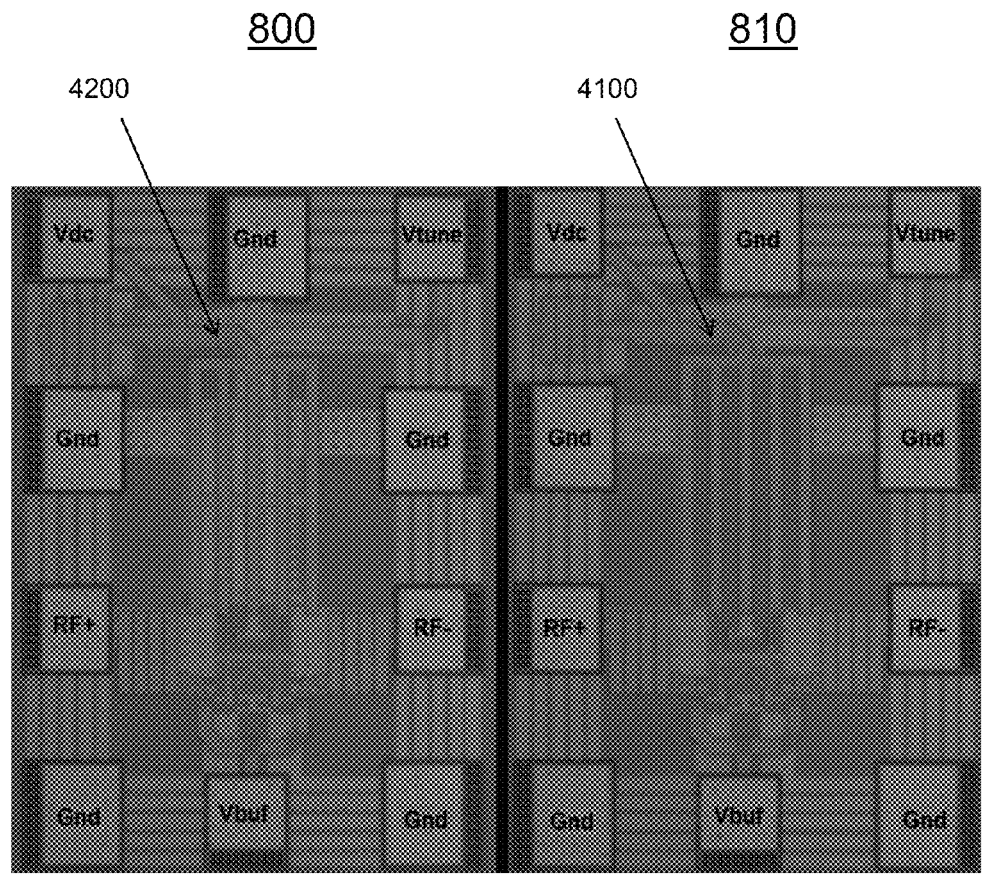
FIG. 8A is a picture of an example embodiment of an integrated standing-wave VCO employing one example embodiment of a differential dual-mode coplanar waveguide resonant element.
FIG. 8B is a picture of an example embodiment of an integrated standing-wave VCO employing an example embodiment of a slow-wave differential dual-mode coplanar waveguide resonant element.

FIG. 8A is a photo of an example embodiment of an integrated standing-wave VCO 800 employing one example embodiment of a differential coplanar waveguide resonant element, and FIG. 8B is a photo of an example embodiment of an integrated standing-wave VCO 810 employing an example embodiment of a slow-wave differential coplanar waveguide resonant element. Each of the VCOs 800 and 810 may have the same circuit configuration as shown in FIG. 1, with the corresponding differential coplanar waveguide resonant element 4100 or slow-wave differential coplanar waveguide resonant element 4200 substituted for inductive element 105, as described above. Each of the VCOs 800 and 810 is fabricated on a single semiconductor substrate (e.g., silicon, gallium arsenide, etc.). The structures of differential coplanar waveguide resonant element 4100 and slow-wave differential coplanar waveguide resonant element 4200 may be clearly seen in FIGS. 8A and 8B, respectively.

Figure 9:
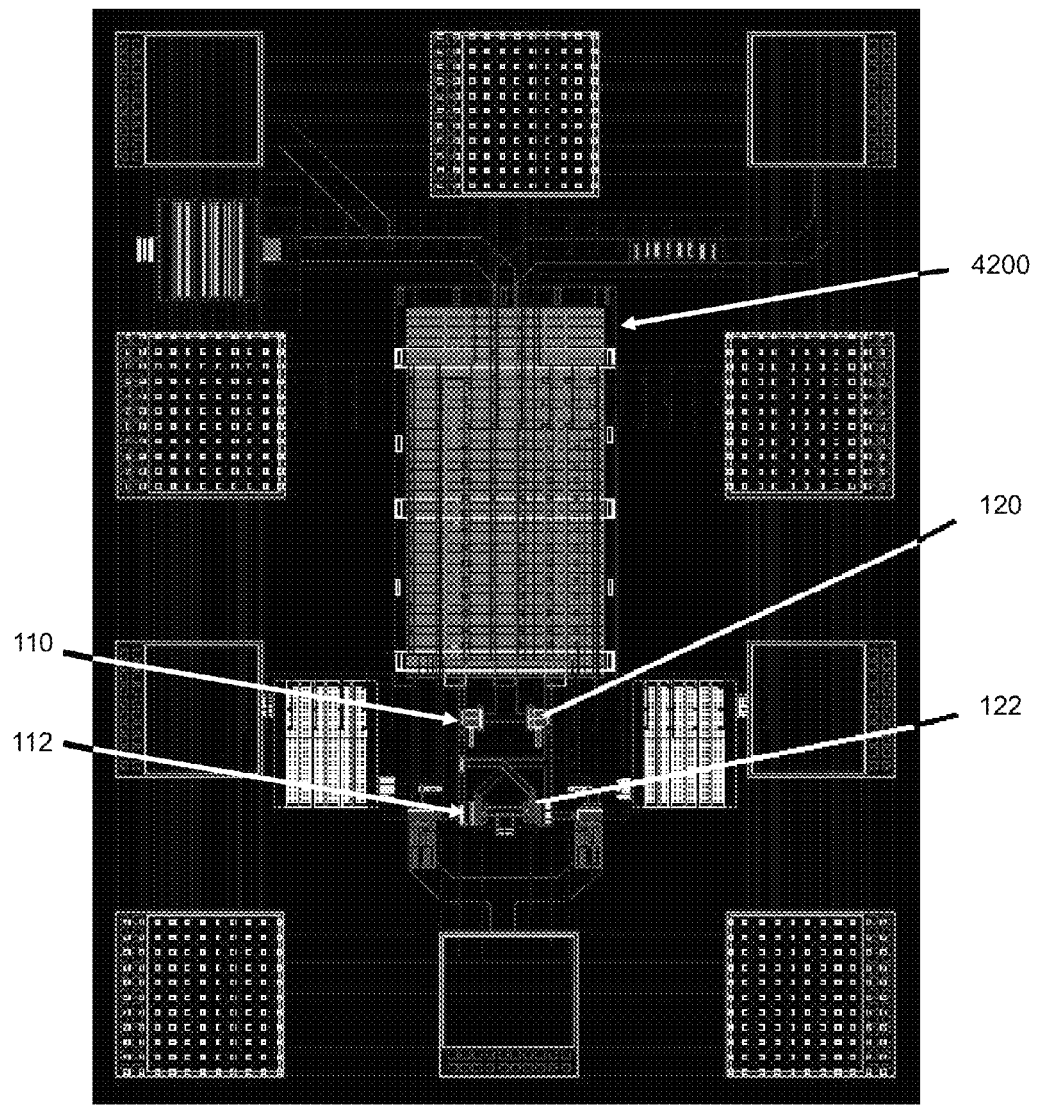
FIG. 9 is another picture of an example embodiment of an integrated VCO employing an example embodiment of a slow-wave differential coplanar waveguide resonant element.

FIG. 9 is another layout drawing of an example embodiment of an integrated standing-wave VCO 900 employing an example embodiment of a slow-wave coplanar waveguide resonant element 4200. FIG. 9 also illustrates locations of voltage-dependent capacitive elements (e.g., varactors) 110 and 120 and oscillator transistors 112 and 122.

Further details regarding one or more embodiments of an integrated standing-wave voltage controlled oscillator with a coplanar waveguide resonator may be found in M. Li wt al., "Standing-Wave Transmission-Line-Resonator VCO for E-band Applications," 12TH ANNUAL IEEE WIRELESS AND MICROWAVE TECHNOLOGY CONFERENCE (WAMICON) (April 2011).

While preferred embodiments are disclosed herein, many variations are possible which remain within the concept and scope of the invention. Such variations would become clear to one of ordinary skill in the art after inspection of the specification, drawings and claims herein. The invention therefore is not to be restricted except within the spirit and scope of the appended claims.

We claim:

1. A voltage controlled oscillator (VCO) integrated with a semiconductor substrate, the VCO comprising:
 a pair of oscillator transistors each having a control terminal and an output terminal, wherein the oscillator transistors are cross-coupled to each other such that an output of each oscillator transistor is coupled to an input of the other oscillator transistor; and
 a resonant circuit connected between the control terminals of the pair of oscillator transistors, wherein the resonant circuit comprises:
  first and second varactors each having a first end thereof connected to a tuning voltage input and having a second end connected to the control terminal of a corresponding one of the oscillator transistors, and
  a dual-mode coplanar waveguide resonator, comprising:
   an electrically conductive common line extending lengthwise in a first direction and connected to a first supply voltage for the oscillator transistors; and
   at least first through fifth electrically conductive lines sequentially arranged lengthwise substantially in parallel with each other in a second direction which is substantially perpendicular to the electrically conductive common line, each of the first through fifth linear electrically conductive lines having a first end and a second end opposite the first end,
  wherein the electrically conductive common line and the first through fifth linear electrically conductive lines are all arranged at a first level with respect to the semiconductor substrate,
  wherein the first ends of the first through fifth electrically conductive lines are all connected to the electrically conductive common line,
  wherein the second ends of the second and fourth electrically conductive lines are each connected to the output terminal of a corresponding one of the oscillator transistors, and
  wherein the second ends of the first, third, and fifth electrically conductive lines are floating; wherein a length of each of the second and fourth electrically conductive lines is substantially less than ¼ of a wavelength at any oscillating frequency of the VCO.

2. The VCO of claim 1, wherein the coplanar waveguide resonator is a slow-wave coplanar waveguide resonator further comprising a floating electrically conductive electrode layer separated and spaced apart from the first through fifth electrically conductive lines at a second level with respect to the semiconductor substrate, wherein the second level is in parallel with the first level.

3. The VCO of claim 2, wherein the floating electrically conductive electrode layer comprises a plurality of separated and spaced apart conductive lines each extending lengthwise in the first direction which is substantially perpendicular to the second direction.

4. The VCO of claim 1, wherein each of the first and second oscillator transistors has a third terminal, the VCO further comprising:
 a current supply resistor having a first end connected to the third terminals of the oscillator transistors and having a second end connected to a second supply voltage for the oscillator transistors; and
 first and second buffers each having an input terminal and an output terminal, each input terminal being connected to the output terminal of a corresponding one of the oscillator transistors, wherein an oscillating output signal of the VCO is provided as a differential signal between the output terminals of the first and second buffers.

5. A voltage controlled oscillator (VCO) integrated with a semiconductor substrate, the VCO comprising:
 a pair of oscillator transistors each having a control terminal and an output terminal, wherein the oscillator transistors are cross-coupled to each other such that an output of each oscillator transistor is coupled to an input of the other oscillator transistor; and
 a resonant circuit connected between the control terminals of the pair of oscillator transistors, wherein the resonant circuit comprises:
  first and second varactors each having a first end thereof connected to a tuning voltage input and having a second end connected to the control terminal of a corresponding one of the oscillator transistors, and
  a dual-mode coplanar waveguide resonator, comprising:
   an electrically conductive common line extending lengthwise in a first direction and connected to a first supply voltage for the oscillator transistors; and
   at least first through fifth electrically conductive lines sequentially arranged lengthwise substantially in parallel with each other in a second direction which is substantially perpendicular to the electrically conductive common line, each of the first through fifth linear electrically conductive lines having a first end and a second end opposite the first end, wherein the electrically conductive common line and the first through fifth linear electrically conductive lines are all arranged at a first level with respect to the semiconductor substrate, wherein the first ends of the first through fifth electrically conductive lines are all connected to the electrically conductive common line, wherein the second ends of the second and fourth electrically conductive lines are each connected to the output terminal of a corresponding one of the oscillator transistors, and wherein the second ends of the first, third, and fifth electrically conductive lines are floating; wherein a length of each of the first through fifth electrically conductive lines is substantially less than ¼ of a wavelength at any oscillating frequency of the VCO.

6. A voltage controlled oscillator (VCO), comprising:

a cross-coupled differential transistor pair having a pair of input terminals and a pair of output terminals; and a resonant circuit coupled to the input terminals of the cross-coupled differential transistor pair, wherein the resonant circuit comprises:

a pair of voltage-dependent capacitive elements, each being connected between a corresponding one of the output terminals of the cross-coupled differential transistor pair and a control voltage terminal; and a pair of inductive elements, each inductive element being connected between a first supply voltage and a corresponding one of the output terminals of the cross-coupled differential transistor pair, wherein each inductive element comprises a coplanar waveguide, wherein each coplanar waveguide includes:

a central signal line connected at a first end to the first supply voltage and at a second end to the corresponding one of the output terminals of the cross-coupled differential transistor pair, and a pair of CPW ground lines disposed on either side of the central signal line, each of the CPW ground lines connected at one end to the first supply voltage and floating at the other end, wherein the pair of inductive elements share one of the CPW ground lines; and, wherein a length of each of the signal lines is substantially less than ¼ of a wavelength at any oscillating frequency of the VCO.

7. The VCO of claim 6, wherein each coplanar waveguide is a slow-wave coplanar waveguide further comprising a floating electrically conductive electrode layer separated and spaced apart from the central signals lines and CPW ground lines.

8. The VCO of claim 7, wherein the floating electrically conductive electrode layer comprises a plurality of separated and spaced apart conductive lines extending lengthwise in a direction substantially perpendicular to a direction from the first end to the second end of the signal line.

9. The VCO of claim 6, wherein the cross-coupled differential transistor pair has a common terminal, the VCO further comprising:

a current supply resistor having a first end connected to the common terminal of the cross-coupled differential transistor pair and having a second end connected to a second supply voltage; and first and second buffers each having an input terminal and an output terminal, each input terminal being connected to a corresponding one of the output terminals of the cross-coupled differential transistor pair, wherein an oscillating output signal of the VCO is provided as a differential signal between the output terminals of the first and second buffers.

10. A standing wave oscillator, comprising:

a cross-coupled differential transistor pair having a pair of input terminals and a pair of output terminals; and a resonant circuit coupled to the input terminals of the cross-coupled differential transistor pair, wherein the resonant circuit comprises:

a capacitance between the input terminals of the cross-coupled differential transistor pair; and a differential dual-mode coplanar waveguide having opposite differential ends thereof connected to respective input terminals of the cross-coupled differential transistor pair, wherein CPW ground lines of the differential coplanar waveguide each have a first end thereof connected to the first supply voltage and have a second end thereof unterminated;

wherein a length of each of arm of the differential dual mode planar waveguide is substantially less than ¼ of a wavelength at any oscillating frequency of the standing wave oscillator.

11. The standing wave oscillator of claim 10, wherein the capacitance is a voltage-dependent capacitance having a value which changes in response to a tuning voltage.

12. The standing wave oscillator of claim 11, further comprising a pair of varactors connected back-to-back, wherein the capacitance is produced from the pair of varactors in response to the tuning voltage.

13. The standing wave oscillator of claim 10, wherein the differential dual-mode coplanar waveguide is a slow-wave differential coplanar waveguide.

14. The standing wave oscillator of claim 10, wherein the cross-coupled differential transistor pair has a common terminal, the standing wave oscillator further comprising:

a current supply resistor having a first end connected to the common terminal of the cross-coupled differential transistor pair and having a second end connected to a second supply voltage; and first and second buffers each having an input terminal and an output terminal, each input terminal being connected to a corresponding one of the output terminals of the cross-coupled differential transistor pair, wherein an oscillating output signal of the standing wave oscillator is provided as a differential signal between the output terminals of the first and second buffers.

* * * * *